United States Patent
Hause et al.

(10) Patent No.: US 6,242,776 B1
(45) Date of Patent: Jun. 5, 2001

(54) DEVICE IMPROVEMENT BY LOWERING LDD RESISTANCE WITH NEW SILICIDE PROCESS

(75) Inventors: Frederick N. Hause, Austin, TX (US); Manfred Horstmann, Dresden; Karsten Wieczorek, Boxdorf, both of (DE)

(73) Assignee: Advanced Micro Devices, Inc.

( * ) Notice: Subject to any disclaimer, the term of this patent is extended or adjusted under 35 U.S.C. 154(b) by 0 days.

(21) Appl. No.: 09/324,879

(22) Filed: Jun. 2, 1999

(51) Int. Cl.[7] .................... H01L 29/76; H01L 29/94; H01L 31/062; H01L 31/113; H01L 31/119
(52) U.S. Cl. .................. 257/344; 237/384; 237/408; 237/755
(58) Field of Search .................... 257/384, 344, 257/350, 377, 382, 754, 755, 756, 757, 770, 408

(56) References Cited

U.S. PATENT DOCUMENTS

| | | | |
|---|---|---|---|
| 5,384,485 | * | 1/1995 | Nishida et al. ............ 257/751 |
| 5,545,578 | * | 8/1996 | Park et al. ............ 437/44 |
| 6,017,784 | * | 1/2000 | Ohta et al. ............ 438/197 |
| 6,057,576 | * | 5/2000 | Hsia et al. ............ 257/344 |

* cited by examiner

Primary Examiner—Ngân V. Ngô
(74) Attorney, Agent, or Firm—Williams, Morgan & Amerson

(57) ABSTRACT

A method is provided for fabricating a semiconductor device on a structure, the method including forming a dielectric layer adjacent a gate conductor of the semiconductor device and above an LDD region of the structure and removing a first portion of the dielectric layer above the gate conductor and above the LDD region. The method also includes forming a first conductive layer above the gate conductor, adjacent the dielectric layer and above the LDD region and saliciding the first conductive layer above the gate conductor and above the LDD region to form a salicided first conductive layer.

14 Claims, 12 Drawing Sheets

DEVICE IMPROVEMENT BY LOWERING LDD RESISTANCE WITH NEW SILICIDE PROCESS

BACKGROUND OF THE INVENTION

1. Field of the Invention

This invention relates generally to semiconductor fabrication technology, and, more particularly, to a method of fabricating a semiconductor device such as a transistor.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the channel length of a transistor also requires reducing the size and area of electrical contacts to active areas, such as $N^+(P^+)$ source/drain regions and a doped-polycrystalline silicon (doped-polysilicon or doped-poly) gate conductor. As the size and area of the electrical contacts to the active areas get smaller, the active area contact resistance increases. Increased active area contact resistance is undesirable for a number of reasons. For example, increased active area contact resistance may reduce device drive current, and source/drain current through the device, and may also adversely affect the overall speed and operation of the transistor.

Typically, depositing titanium (Ti) or cobalt (Co) on the active area electrical contacts may decrease active area contact resistance. The Ti may then be silicided by annealing with a heat-treatment to form titanium silicide ($TiSi_2$) at the active area electrical contacts (self-aligned silicidation or salicidation). The salicided $TiSi_2$ lowers active area contact resistance.

As shown in FIG. 1, a metal oxide semiconductor field effect transistor (MOSFET or MOS transistor) 100 may be formed on a semiconducting substrate 105, such as doped-silicon. The MOS transistor 100 may have a doped-poly gate 110 formed above a gate oxide 115 formed above the semiconducting substrate 105. The doped-poly gate 110 and the gate oxide 115 may be separated from $N^+$-doped ($P^+$-doped) source/drain regions 120 of the MOS transistor 100 by dielectric spacers 125. The dielectric spacers 125 may be formed above $N^-$-doped ($P^-$-doped) lightly doped drain (LDD) regions 130.

The $N^-$-doped ($P^-$-doped) LDD regions 130 are typically provided to reduce the magnitude of the maximum channel electric field found close to the $N^+$-doped ($P^+$-doped) source/drain regions 120 of the MOS transistor 100, and, thereby, to reduce the associated hot-carrier effects. The lower (or lighter) doping of the $N^-$-doped ($P^-$-doped) LDD regions 130, relative to the $N^+$-doped ($P^+$-doped) source/drain regions 120 of the MOS transistor 100, reduces the magnitude of the maximum channel electric field found close to the $N^+$-doped ($P^+$-doped) source/drain regions 120 of the MOS transistor 100, but increases the source-to-drain resistances of the $N^-$-doped ($P^-$-doped) LDD regions 130.

As shown in FIG. 2, a Ti metal layer 235 may be blanket-deposited on the MOS transistor 100 shown in FIG. 1 and then subjected to an initial rapid thermal anneal (RTA) process performed at a temperature ranging from approximately 450–800° C. for a time ranging from approximately 15–60 seconds. At surfaces 240 of active areas 245, such as the $N^+$-doped ($P^+$-doped) source/drain regions 120 and the doped-poly gate 110, exposed Si reacts upon heating with the Ti metal layer 235 to form $TiSi_2$ at the surfaces 240 of the active areas 245. The Ti metal layer 235 is not believed to react with the dielectric spacers 125 upon heating.

As shown in FIG. 3, a wet chemical strip of the Ti metal layer 235 removes excess, unreacted portions (not shown) of the Ti metal layer 235, leaving behind the salicided $TiSi_2$ 350 only at and below the surfaces 240 of the active areas 245. The salicided $TiSi_2$ 350 may then be subjected to a final RTA process performed at a temperature ranging from approximately 800–1000° C. for a time ranging from approximately 10–60 seconds.

However, even though conventional salicided $TiSi_2$ (or salicided $CoSi_2$) lowers the contact resistances of the active areas 245, such as the $N^+$-doped ($P^+$-doped) source/drain regions 120 and the doped-poly gate 110, the $N^-$-doped ($P^-$-doped) LDD regions 130 continue to degrade the device drive current, and the source/drain current through the device, because of the higher resistances of the $N^-$-doped ($P^-$-doped) LDD regions 130. The overall source-to-drain resistance, even with the conventional salicided $TiSi_2$ 350 in the $N^+$-doped ($P^+$-doped) source/drain regions 120, is significantly determined by the lower dopings, and, hence, higher resistances, of the $N^-$-doped ($P^-$-doped) LDD regions 130.

The present invention is directed to overcoming, or at least reducing the effects of, one or more of the problems set forth above.

SUMMARY OF THE INVENTION

In one aspect of the present invention, a method is provided for fabricating a semiconductor device on a structure, the method including forming a dielectric layer adjacent a gate conductor of the semiconductor device and above an LDD region of the structure and removing a first portion of the dielectric layer above the gate conductor and above the LDD region. The method also includes forming a first conductive layer above the gate conductor, adjacent the dielectric layer and above the LDD region and saliciding the first conductive layer above the gate conductor and above the LDD region to form a salicided first conductive layer.

In another aspect of the present invention, a semiconductor device is provided including a structure, a gate dielectric above the structure and a gate conductor above the gate dielectric. The semiconductor device also includes an LDD region of the structure adjacent the gate dielectric and the gate conductor, a dielectric layer adjacent the gate conductor and the gate dielectric, and a salicided first conductive layer above the gate conductor and above the LDD region.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
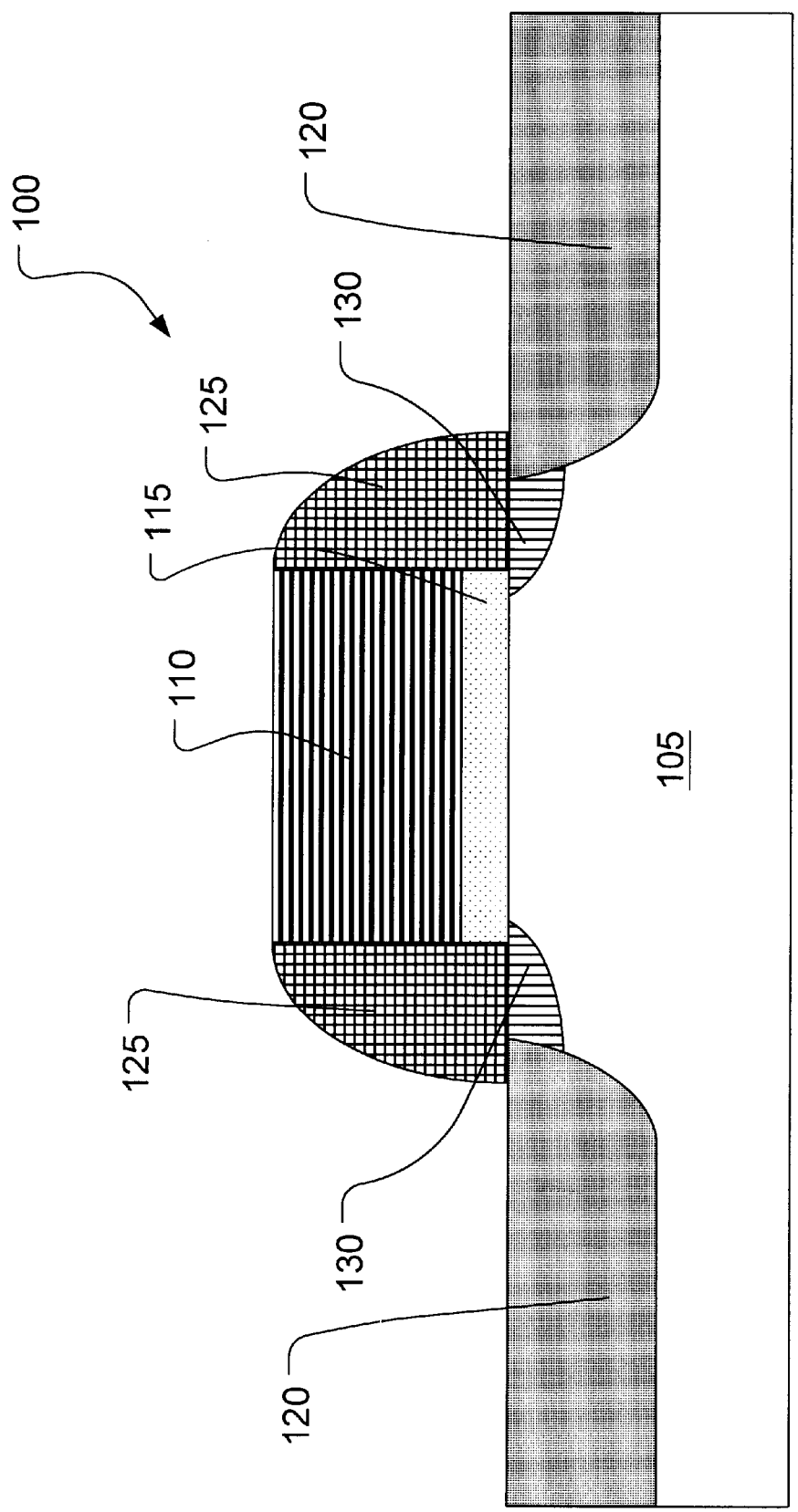
FIGS. 1–3 illustrate schematically in cross-section a conventional salicidation method for MOS transistor fabrication.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for semiconductor device fabrication according to the present invention are shown in FIGS. 4–12. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

Figure 4:
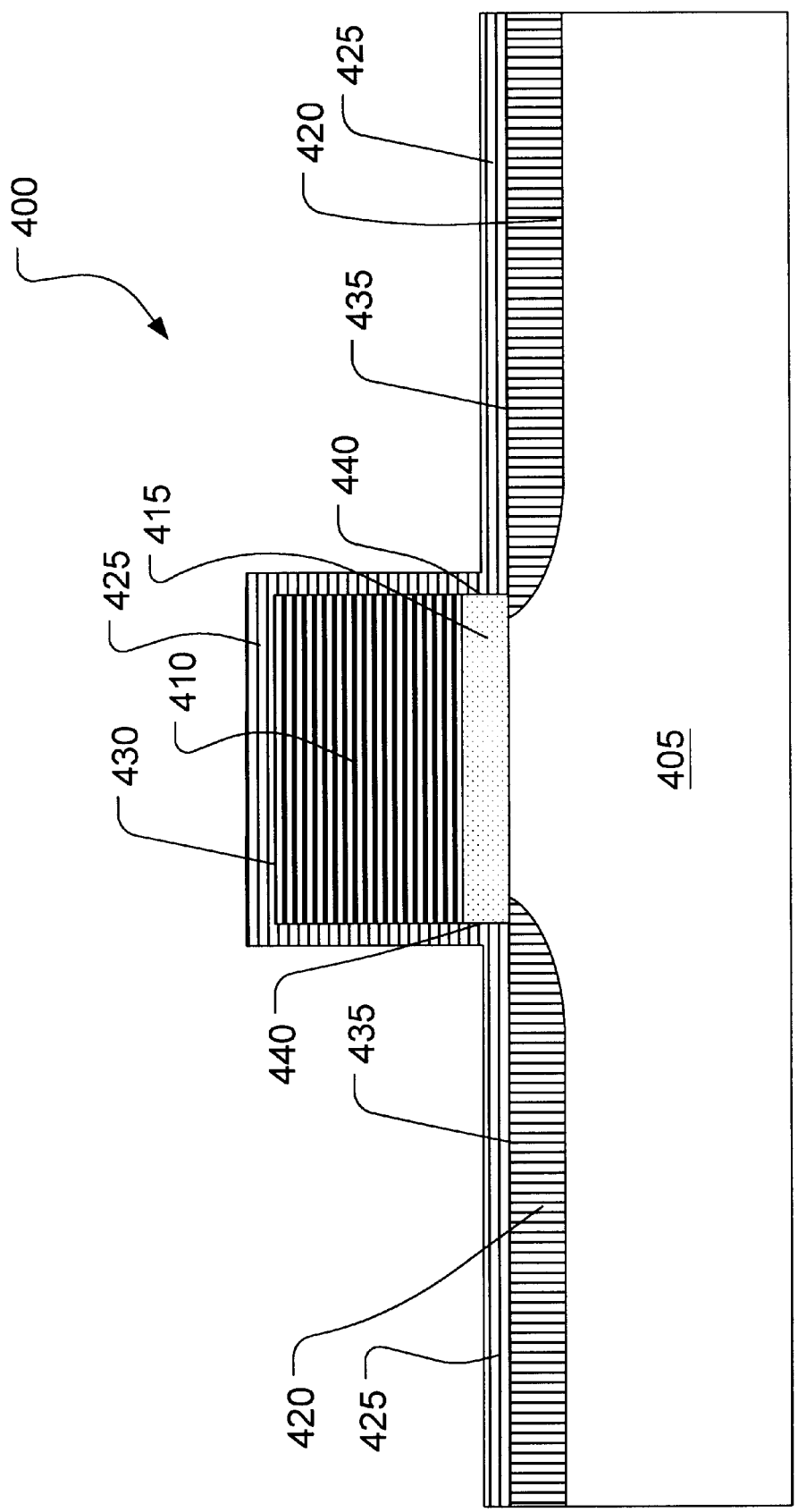
FIGS. 4–12 illustrate schematically in cross-section various embodiments of a method for semiconductor device fabrication according to the present invention.

As shown in FIG. 4, a MOS transistor 400 may be formed on a structure 405 such as a semiconducting substrate (e.g., doped-silicon). The MOS transistor 400 may have a doped-poly gate 410 formed above a gate dielectric 415 formed above the structure 405.

The doped-poly gate 410 may doped with arsenic (As) for an NMOS transistor, for example, or boron (B) for a PMOS transistor, to render the poly more conductive. The poly may be formed undoped, by an LPCVD process for higher throughput, to have a thickness ranging from approximately 1000–2000 Å, for example. The doping of the poly may conveniently be accomplished by diffusing or implanting the dopant atoms and/or molecules through the upper surface of the poly. The doped-poly gate 410 may then be subjected to a heat-treating process that may be a rapid thermal anneal (RTA) process performed at a temperature ranging from approximately 800–1100° C. for a time ranging from approximately 5–60 seconds.

The gate dielectric 415 may have a thickness ranging from approximately 25–50 Å, for example, and may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

The gate dielectric 415 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. The gate dielectric 415 may have an equivalent oxide thickness $t_{ox-eq}$ ranging from approximately 25–50 Å, for example. An equivalent oxide thickness $t_{ox-eq}$ may be defined to be the thickness t of a dielectric material (with a dielectric constant K) that would have a capacitance C that is approximately the same as the capacitance $C_{ox}$ that a thickness $t_{ox-eq}$ of silicon dioxide ($SiO_2$) would have. Since $SiO_2$ has a dielectric constant $K_{ox}$ of approximately 4, and since $C=K/t$ and $C_{ox}=K_{ox}/t_{ox-eq}$, then $t=K/C=K/C_{ox}=Kt_{ox-eq}/K_{ox}=Kt_{ox-eq}/4$, approximately. For example, the gate dielectric 415 may be formed of a tantalum oxide ($Ta_xO_y$, e.g., $Ta_2O_5$) with a dielectric constant $K_{TaO}$ of approximately 24. Then, using $t=K_{TaO}/C=K_{TaO}/C_{ox}=K_{TaO}t_{ox-eq}/K_{ox}=24t_{ox-eq}/4$, approximately, an equivalent oxide thickness $t_{ox-eq}$ ranging from approximately 25–50 Å would correspond to a $Ta_2O_5$ thickness $t_{TaO}$ ranging from approximately 150–300 Å.

The doped-poly gate 410 and the gate dielectric 415 may be adjacent $N^-$-doped ($P^-$-doped) lightly doped drain (LDD) regions 420 formed in the structure 405. In illustrative embodiments, the $N^-$-doped ($P^-$-doped) LDD regions 420 may be formed by being implanted with an LDD dose of arsenic (As, for $N^-$-doping appropriate for an NMOS transistor 400) or boron difluoride ($BF_2$, for $P^-$-doping appropriate for a PMOS transistor 400). The LDD dose may range from about $1.0 \times 10^{14}$–$1.0 \times 10^{15}$ ions/cm$^2$ at an implant energy ranging from about 3–50 keV. The $N^-$-doping ($P^-$-doping) LDD regions 420 may be subjected to an RTA process performed at a temperature ranging from approximately 800–1100° C. for a time ranging from approximately 5–60 seconds. The RTA process may activate the implant and form a more sharply defined and less graded activated implant junction with the structure 405 than would an RTA process following an implant with an LDD dose of more mobile phosphorus (P, for $N^-$-doping appropriate for an NMOS transistor 400) or boron (B, for $P^-$-doping appropriate for a PMOS transistor 400).

As shown in FIG. 4, a dielectric layer 425 may be formed adjacent the doped-poly gate 410 and the gate dielectric 415 of the MOS transistor 400 and above the $N^-$-doped ($P^-$-doped) LDD regions 420. The dielectric layer 425 may be formed by a variety of known techniques for forming such layers, e.g., chemical vapor deposition (CVD), low-pressure CVD (LPCVD), plasma-enhanced CVD (PECVD), sputtering, physical vapor deposition (PVD), thermal growing, and the like, and may have an equivalent oxide thickness $t_{ox-eq}$ ranging from approximately 50 Å–300 Å, for example.

The dielectric layer 425 may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitro genbearing $SiO_2$), a nitrogen-doped oxide (e.g., $N_2$-implanted $SiO_2$), silicon oxynitride ($Si_xO_yN_z$), and the like. The dielectric layer 425 may also be formed of any suitable "low dielectric constant" or "low K" material, where K is less than or equal to about 4. Alternatively, the dielectric layer 425 may be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. In one illustrative embodiment, the dielectric layer 425 is comprised of a silicon dioxide ($SiO_2$) having a thickness of approximately 50 Å, which is formed by being blanket-deposited by an LPCVD process for higher throughput.

In another illustrative embodiment, the dielectric layer 425 may be formed by, for example, thermally growing a layer of dielectric material on the exposed surfaces 430 and 435 of the respective doped-poly gate 410 and the N$^-$-doped (P$^-$-doped) LDD regions 420. Note that, in this case (not shown), the material for the dielectric layer 425 would not be expected to grow thermally on the exposed sidewall 440 of the gate dielectric 415. In this illustrative embodiment, the dielectric layer 425 may be comprised of $SiO_2$, having a thickness of approximately 50 Å, which is thermally grown for higher throughput. The thermal growth may be performed in a traditional tube furnace, at a temperature ranging from approximately 700–900° C., for a time period ranging from approximately 2–10 minutes, in a nitrogen-containing ambient that may include at least one of nitrous oxide ($N_2O$), nitric oxide (NO), ammonia ($NH_3$), and the like. Alternatively, the thermal growth may be an RTA process performed at a temperature ranging from approximately 700–900° C. for a time ranging from approximately 5–30 seconds in a nitrogen-containing ambient that may include at least one of nitrous oxide ($N_2O$), nitric oxide (NO), ammonia ($NH_3$), and the like.

Figure 5:
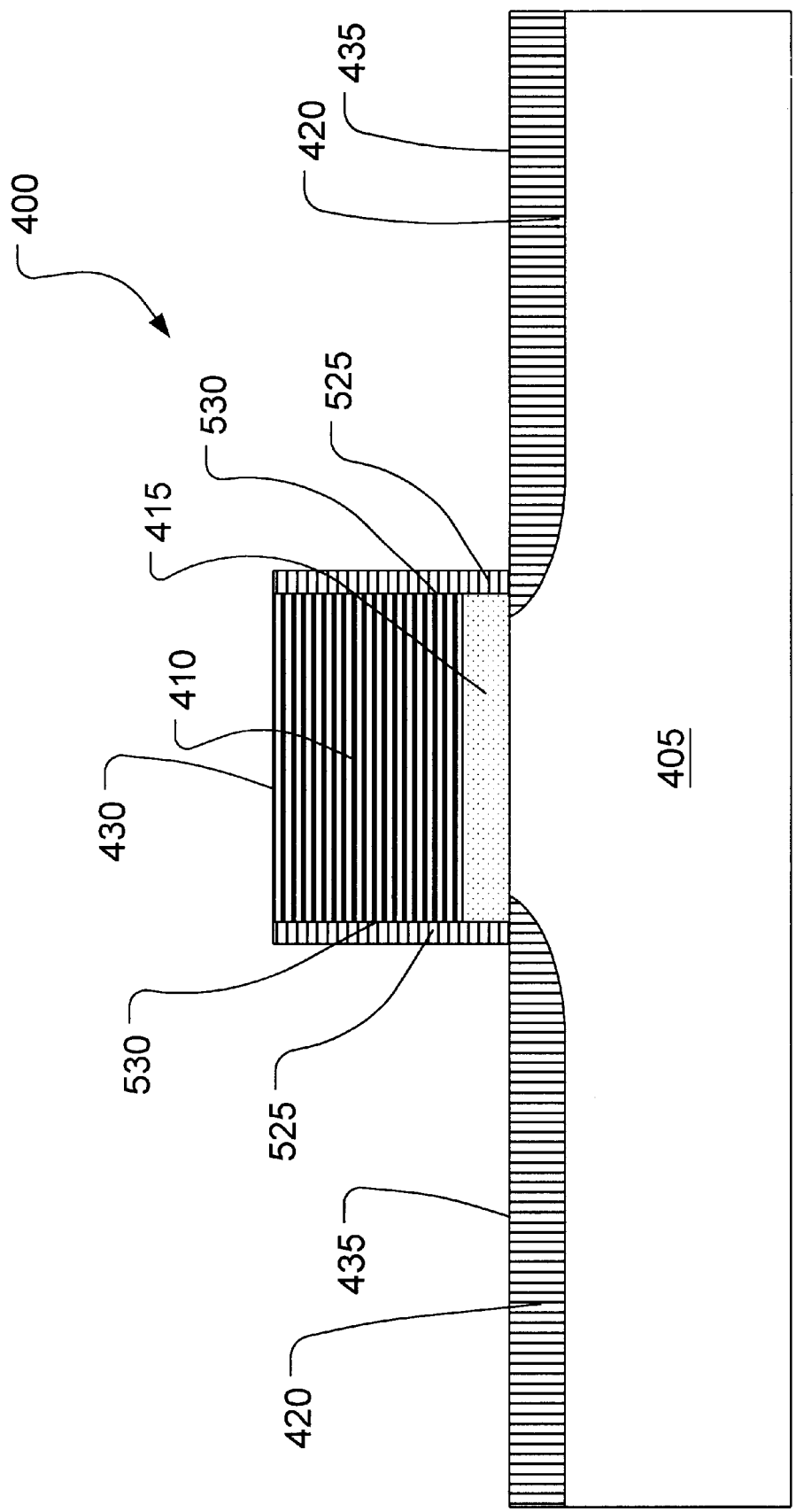

As shown in FIG. 5, portions 525 of the dielectric layer 425 remaining on the sidewalls 530 of the doped-poly gate 410 and the gate dielectric 415 of the MOS transistor 400 may be formed using a variety of known anisotropic etching techniques, such as a reactive ion etching (RIE) process using hydrogen bromide (HBr) and argon (Ar) as the etchant gases, for example. Alternatively, an RIE process with $CHF_3$ and Ar as the etchant gases may be used, for example. This anisotropic etching removes portions (not shown) of the dielectric layer 425 from above the respective upper surfaces 430 and 435 of the doped-poly gate 410 and the N$^-$-doped (P$^-$-doped) LDD regions 420 while retaining the portions 525 remaining on the sidewalls 530.

Figure 6:
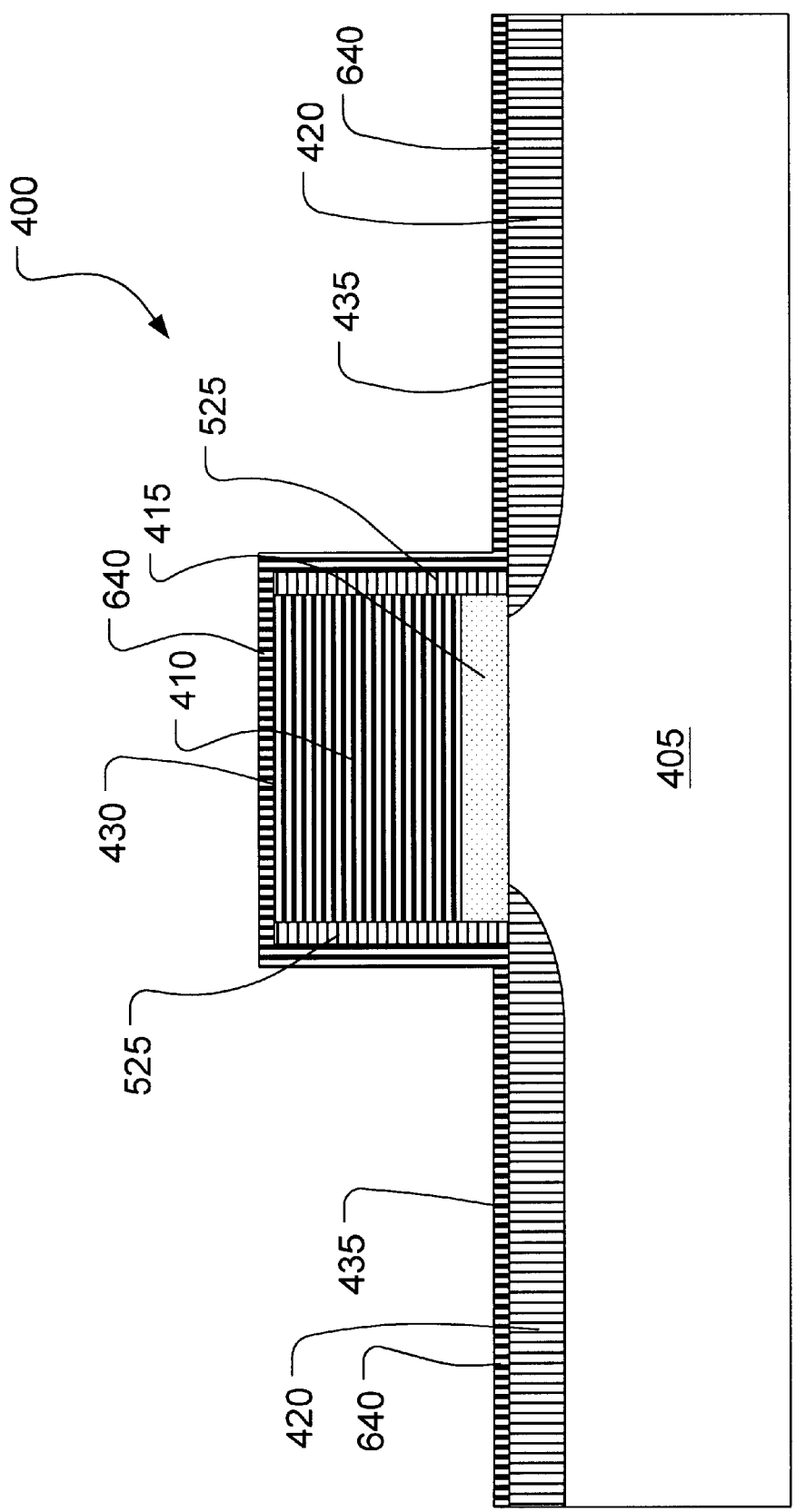

As shown in FIG. 6, a first conductive layer 640 may be formed above the respective upper surfaces 430 and 435 of the doped-poly gate 410 and the N$^-$-doped (P$^-$-doped) LDD regions 420, and adjacent the portions 525 of the dielectric layer 425 remaining on the sidewalls 530. The first conductive layer 640 may be formed by a variety of known techniques, e.g., high-density ionized metal plasma (IMP) deposition, high-density inductively coupled plasma (ICP) deposition, sputtering, PVD, CVD, LPCVD, PECVD, and the like, and may have a thickness ranging from approximately 50–150 Å.

The first conductive layer 640 may be formed of a variety of materials suitable to form a high-temperature-stable, thin silicide able to withstand the elevated temperatures of annealing and heating, such as RTA processes used to diffuse and activate ion-implanted dopants. Such dopant-activating RTA processes may be performed at temperatures ranging from approximately 800–1100° C. for a time ranging from approximately 5–60 seconds.

The first conductive layer 640 may also be formed of a variety of materials suitable to form a high-temperature-stable, thin silicide that is also stable against agglomeration. Agglomeration is believed to be the tendency of some silicides, such as titanium silicide ($TiSi_2$) and zirconium silicide ($ZrSi_2$), to try to minimize their surface areas at high temperatures by balling up and forming spheres that increase the resistance of the agglomerated silicides. The first conductive layer 640 may be formed by blanket-depositing refractory metals such as tungsten (W), molybdenum (Mo), cobalt (Co), and the like, above the respective upper surfaces 430 and 435 of the doped-poly gate 410 and the N$^-$-doped (P$^-$-doped) LDD regions 420, and adjacent the portions 525 of the dielectric layer 425 remaining on the sidewalls 530.

Figure 7:
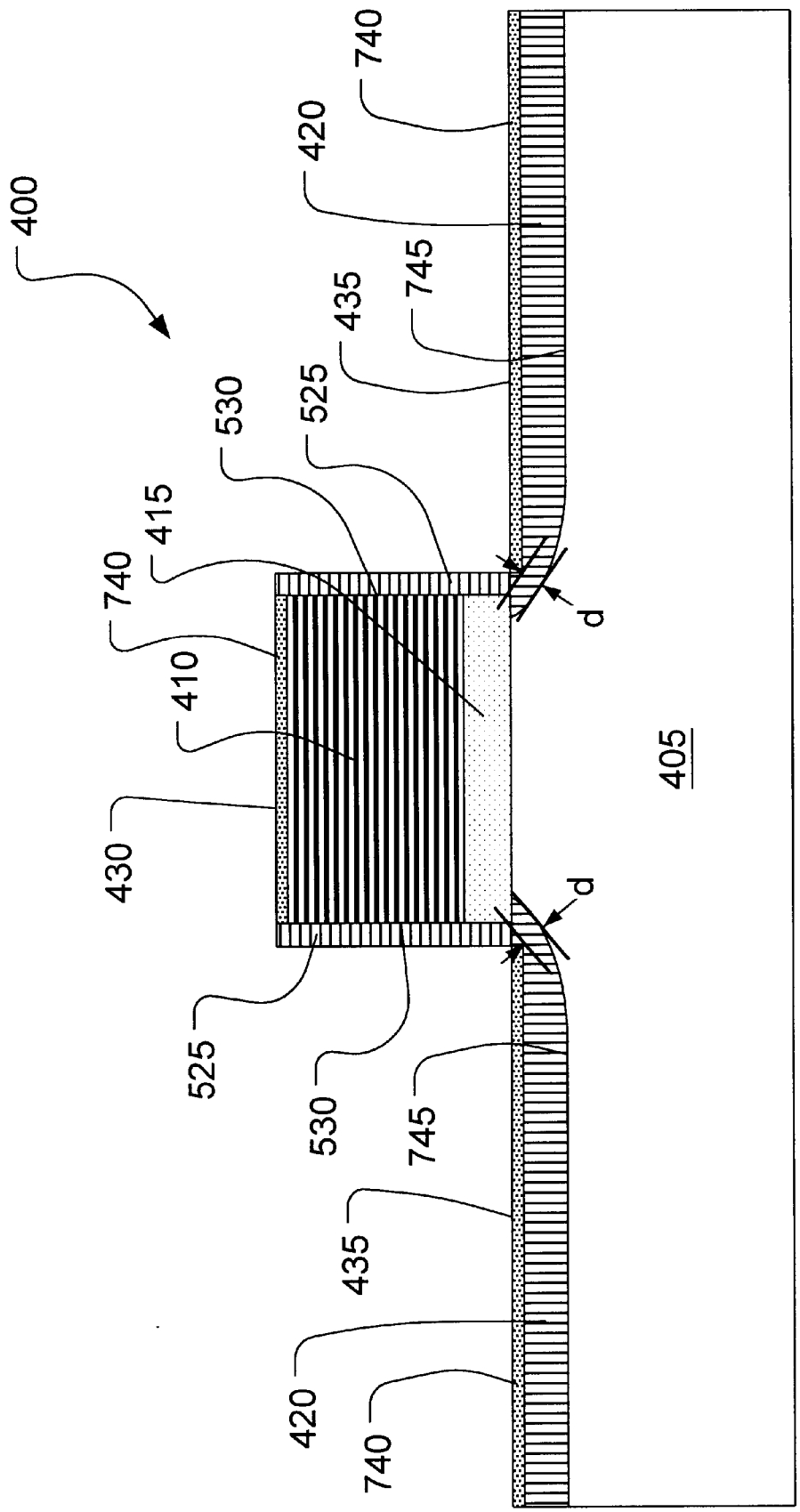

As shown in FIG. 7, the first conductive layer 640 may then be subjected to a self-aligned silicidation (salicidation) process to render the doped-poly gate 410 and the N$^-$-doped (P$^-$-doped) LDD regions 420 more conductive, for example. In particular, self-aligned silicided (salicided) first conductive layers 740 are formed only at the respective upper surfaces 430 and 435 of the doped-poly gate 410 and the N$^-$-doped (P$^-$-doped) LDD regions 420. As shown in FIG. 7, a minimum distance d may be provided between the salicided first conductive layers 740 and a junction 745 between the N$^-$-doped (P$^-$-doped) LDD regions 420 and the structure 405. The minimum distance d may be in a range of at least about 50 Å–200 Å.

The first conductive layer 640 may be subjected to the first step of a two-step heat-treating process to begin converting the first conductive layer 640 into a metal silicide. For example, the first step of the two-step heat-treating process may be an RTA process performed at a temperature ranging from approximately 450–800° C. for a time ranging from approximately 15–60 seconds. It is believed that only upper portions of the doped-poly gate 410 and the N$^-$-doped (P$^-$-doped) LDD regions 420 below the respective upper surfaces 430 and 435 would be consumed to form the metal silicide of the salicided first conductive layers 740. It is further believed that silicide will not form on the portions 525 of the dielectric layer 425 remaining on the sidewalls 530, facilitating the self-alignment of the salicidization process.

Unsilicided material in the first conductive layer 640, particularly adjacent the portions 525 of the dielectric layer 425 remaining on the sidewalls 530, may be removed by a cleaning and/or a wet chemical stripping, for example. Thereafter, the remaining silicided material may be subjected to the second step of the two-step heat-treating process to finish converting the remaining portions of the first conductive layer 640 into the metal silicide of the salicided first conductive layers 740. The salicidization process renders the doped-poly gate 410 and the N$^-$-doped (P$^-$-doped) LDD regions 420 of the structure 405 more conductive by providing the salicided first conductive layers 740, lowering the overall resistivity of the MOS transistor 400.

Figure 8:
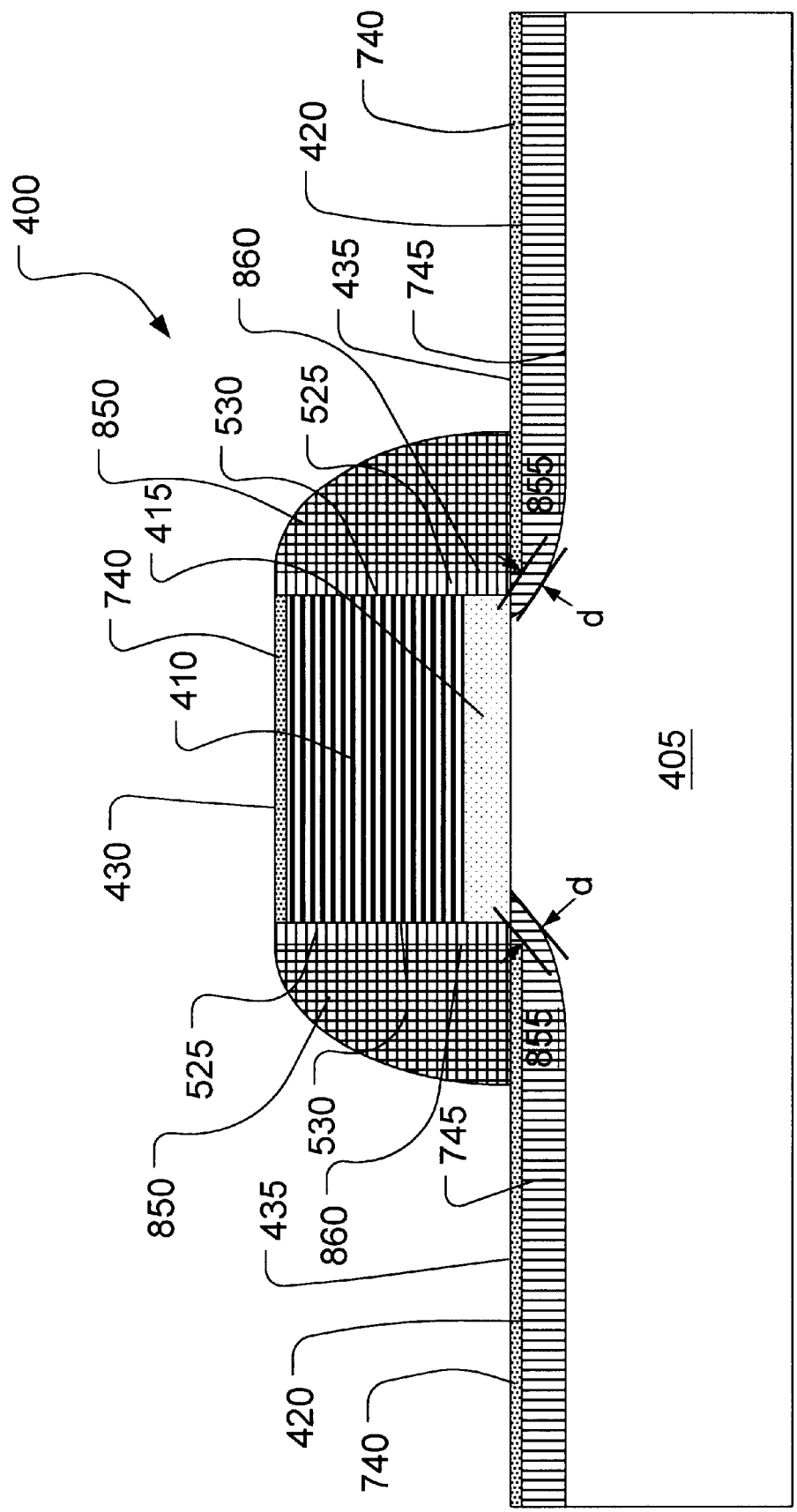

As shown in FIG. 8, dielectric spacers 850 may be formed by a variety of techniques above the salicided first conductive layers 740 above portions 855 of the N$^-$-doped (P$^-$-doped) LDD regions 420 and adjacent the portions 525 of the dielectric layer 425 remaining on the sidewalls 530. For example, the dielectric spacers 850 may be formed by depositing a conformal layer of the appropriate material above and adjacent the doped-poly gate 410 and the portions 525 of the dielectric layer 425 remaining on the sidewalls 530 and then performing an anisotropic RIE process on the conformally blanket-deposited layer. The dielectric spacers 850 may each have a base thickness ranging from approximately 300–1500 Å, for example, as measured horizontally from the sidewalls 860 of the portions 525 of the dielectric layer 425 remaining on the sidewalls 530. The dielectric spacers 850, like the dielectric layer 425, may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), nitrogen-bearing $SiO_2$, silicon nitride ($Si_3N_4$), silicon oxynitride ($Si_xO_yN_z$), and the like. The dielectric spacers 850 may also be formed of any suitable "low dielectric constant" or "low K" material, where K is less than or equal to about 4. Additionally, the dielectric spacers 850 may be comprised of a fluorine-doped oxide, a fluorine-doped nitride, a fluorine-doped oxynitride, a fluorine-doped low K material, and the like. In one illustrative embodiment, the dielectric spacers 850 are comprised of $SiO_2$, having a base thickness of approximately 300 Å.

In another illustrative embodiment, the dielectric spacers 850 may be comprised of a material selective to the salicided first conductive layers 740. For example, if the salicided first conductive layers 740 were comprised of $CoSi_2$, then the dielectric spacers 850 may be comprised of an oxynitride.

Figure 9:
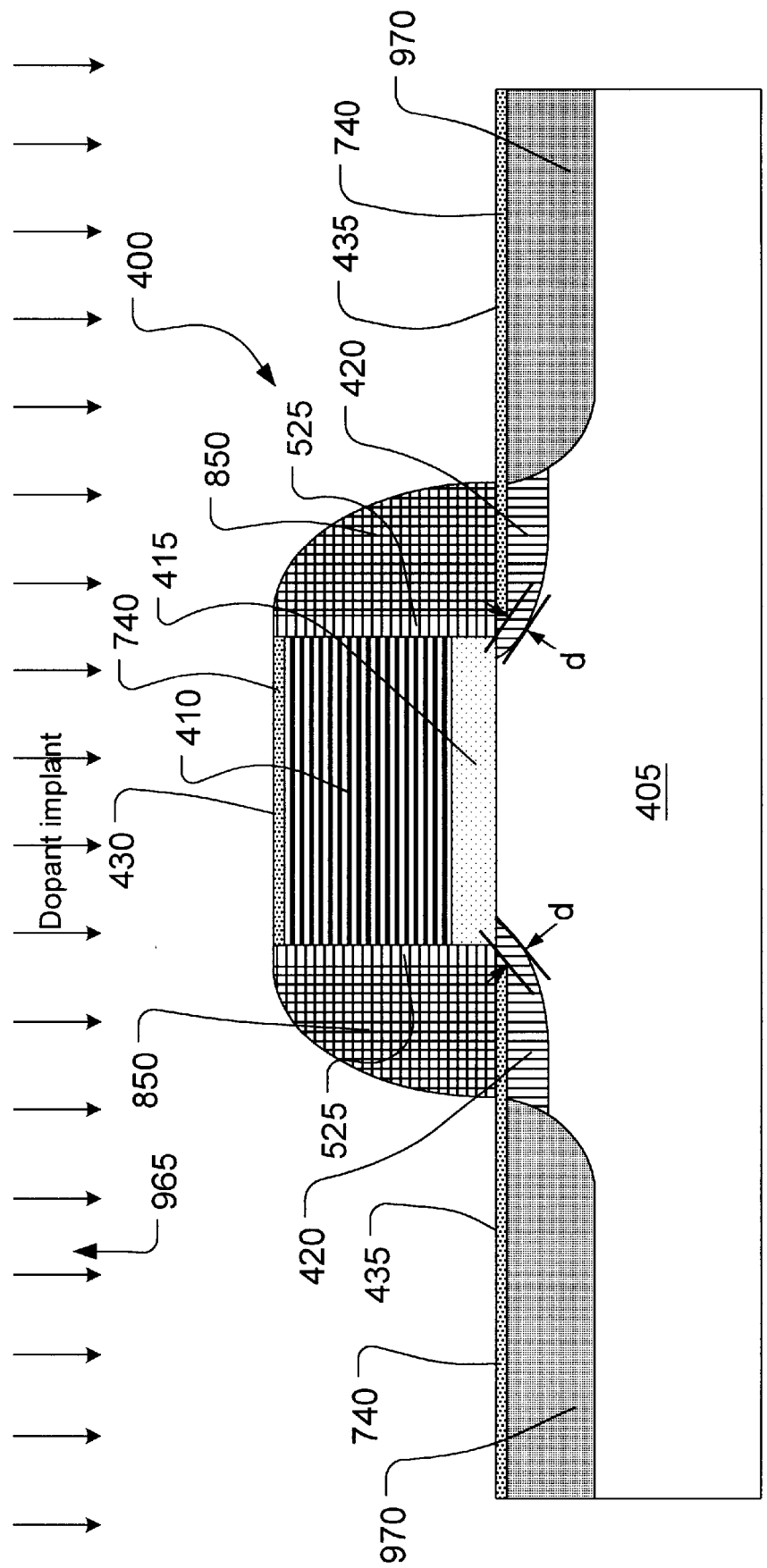

As shown in FIG. 9, a dopant 965 (indicated by arrows) may be implanted to introduce dopant atoms and/or molecules to form $N^+$-doped ($P^+$-doped) source/drain regions 970. In one illustrative embodiment, a dose of the dopant 965 atoms and/or molecules may range from approximately $1.0 \times 10^{15}$–$5.0 \times 10^{15}$ ions/cm$^2$ of the appropriate dopant 965 atoms and/or molecules, e.g., phosphorus (P) for an illustrative NMOS transistor or boron (B) for an illustrative PMOS transistor. An implant energy of the dopant 965 atoms and/or molecules may range from approximately 30–100 keV. In another illustrative embodiment, a dose of the dopant 965 atoms is approximately $1.0 \times 10^{15}$ ions/cm$^2$ of P for an NMOS transistor or B for a PMOS transistor at an implant energy of approximately 30 keV.

The dopant 965 may be an $N^+$ implant such as phosphorus (P), arsenic (As), antimony (Sb), bismuth (Bi), and the like, and may form heavily doped $N^+$ source/drain regions 970. An $N^+$ implant would be appropriate for the fabrication of an NMOS transistor 400, for example. Alternatively, the dopant 965 may be a $P^+$ implant such as boron (B), boron fluoride (BF, $BF_2$), aluminum (Al), gallium (Ga), Indium (In), Thallium (Tl), and the like, and may form heavily doped $P^+$ source/drain regions 970. A $P^+$ implant would be appropriate for the fabrication of a PMOS transistor 400, for example.

Figure 10:
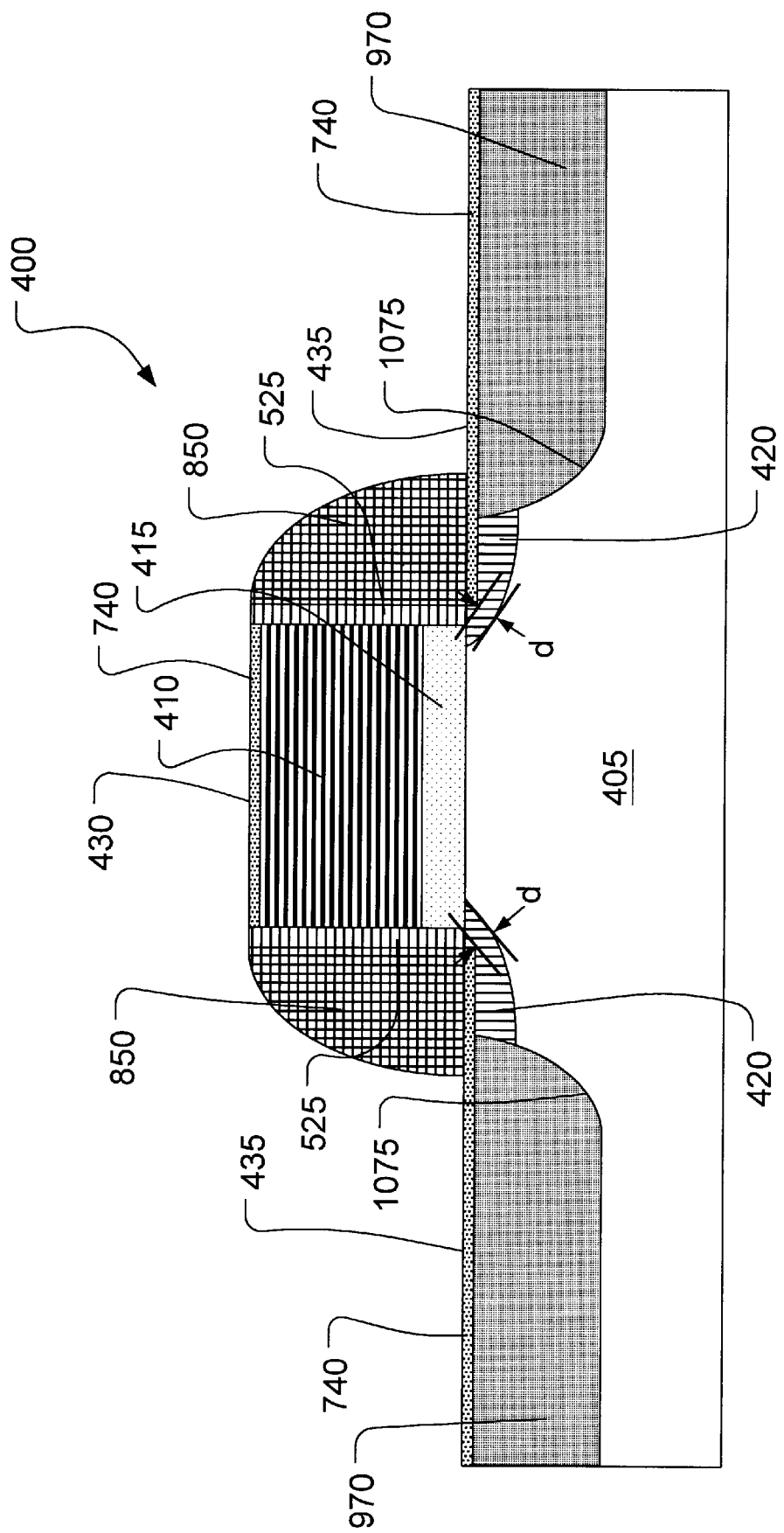

As shown in FIG. 10, the $N^+$-doped ($P^+$-doped) source/drain regions 970 may be subjected to an RTA process performed at a temperature ranging from approximately 800–1100° C. for a time ranging from approximately 5–60 seconds. The RTA process may activate the implant of the more mobile P (for $N^+$-doping appropriate for an NMOS transistor 400) or B (for $P^+$-doping appropriate for a PMOS transistor 400) and form a less sharply defined and more graded activated implant junction 1075 with the structure 405 than would an RTA process following an implant with a source/drain dose of less mobile As (for $N^+$-doping appropriate for an NMOS transistor) or $BF_2$ (for $P^+$-doping appropriate for a PMOS transistor).

Alternatively, an RTA process to diffuse and activate the $N^+$-doped ($P^+$-doped) source/drain regions 970 may be performed in conjunction with a second salicidation described in more detail below (see FIGS. 11–12), either prior to, during or following the second salicidation. Such a salicidation-conjoined RTA process may be performed at a temperature ranging from approximately 800–1000° C. for a time ranging from approximately 10–60 seconds.

Figure 11:
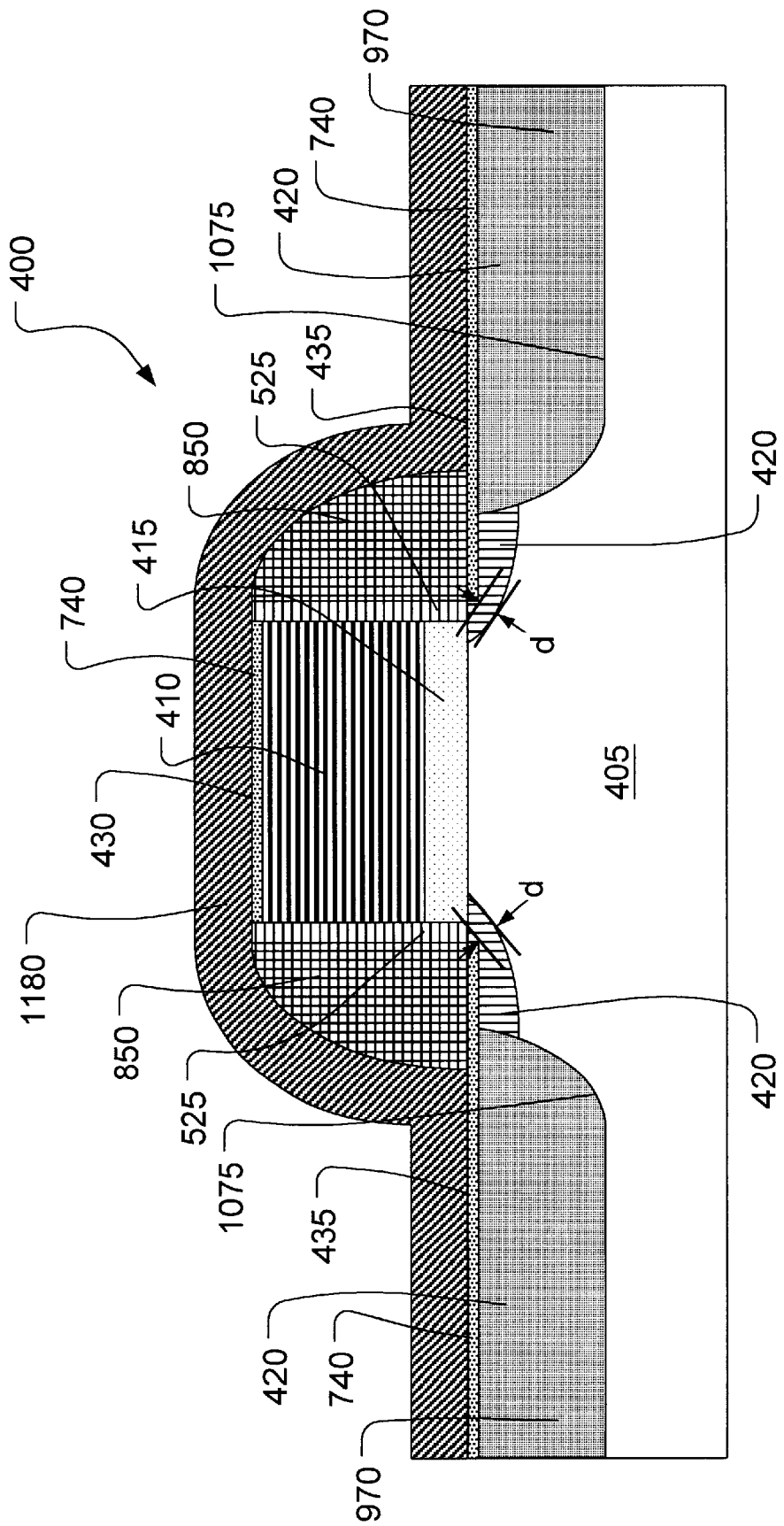

As shown in FIG. 11, a second conductive layer 1180 may be formed above the respective upper surfaces 430 and 435 of the salicided first conductive layers 740 above the doped-poly gate 410 and the $N^+$-doped ($P^+$-doped) source/drain regions 970, and adjacent the dielectric spacers 850. The second conductive layer 1180 may be formed by a variety of known techniques, e.g., high-density ionized metal plasma (IMP) deposition, high-density inductively coupled plasma (ICP) deposition, sputtering, PVD, CVD, LPCVD, PECVD, and the like, and may have a thickness ranging from approximately 100–400 Å.

The second conductive layer 1180 may be formed of a variety of materials suitable to form suicides such as titanium silicide ($TiSi_2$) and zirconium silicide ($ZrSi_2$). The second conductive layer 1180 may be formed by blanket-depositing metals such as titanium (Ti), zirconium (Zr), tungsten (W), tantalum (Ta), nickel (Ni), molybdenum (Mo), cobalt (Co), and the like, above the respective upper surfaces 430 and 435 of the salicided first conductive layers 740 above the doped-poly gate 410 and the $N^+$-doped ($P^+$-doped) source/drain regions 970, and adjacent the dielectric spacers 850.

Figure 12:
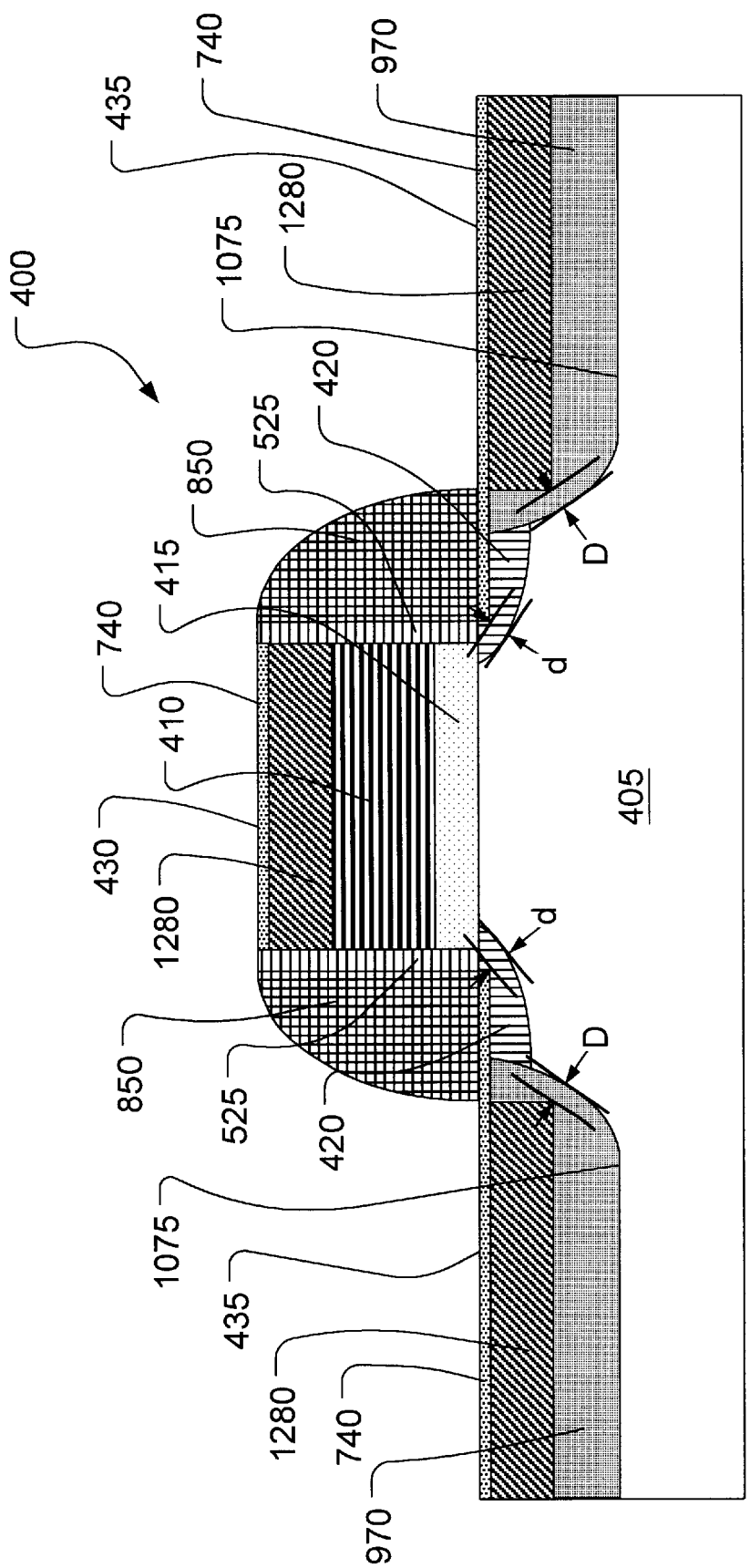

As shown in FIG. 12, the second conductive layer 1180 may then be subjected to a salicidation process to render the doped-poly gate 410 and the $N^+$-doped ($P^+$-doped) source/drain regions 970 more conductive, for example. In particular, salicided second conductive layers 1280 are formed only at and below the respective upper surfaces 430 and 435 of the doped-poly gate 410 and the $N^+$-doped ($P^+$-doped) source/drain regions 970. As shown in FIG. 12, a minimum distance D may be provided between the salicided second conductive layers 1280 and a junction 1075 between the $N^+$-doped ($P^+$-doped) source/drain regions 970 and the structure 405. The minimum distance D may be in a range of at least about 50 Å–200 Å.

The second conductive layer 1180 may be subjected to the first step of a two-step heat-treating process to begin diffusing the metal atoms of the second conductive layer 1180 through the salicided first conductive layers 740 and to begin converting the second conductive layer 1180 into a metal silicide. For example, the first step of the two-step heat-treating process may be an RTA process performed at a temperature ranging from approximately 450–800° C. for a time ranging from approximately 15–60 seconds. It is believed that only upper portions of the doped-poly gate 410 and the $N^+$-doped ($P^+$-doped) source/drain regions 970 below the respective upper surfaces 430 and 435 would be consumed to form the metal silicide of the salicided second conductive layers 1280. It is further believed that silicide will not form on the dielectric spacers 850, facilitating the self-alignment of the salicidization process.

Unsilicided material in the second conductive layer 1180, particularly adjacent the dielectric spacers 850, may be removed by a cleaning and/or a wet chemical stripping, for example. Thereafter, the remaining silicided material may be subjected to the second step of the two-step heat-treating process to finish converting the remaining portions of the second conductive layer 1180 into the metal silicide of the salicided second conductive layers 1280. The salicidization process renders the doped-poly gate 410 and the $N^+$-doped ($P^+$-doped) source/drain regions 970 of the structure 405 more conductive by providing the salicided second conductive layers 1280, lowering the overall resistivity of the MOS transistor 400.

Any of the above-disclosed embodiments of a method for fabricating a semiconductor device according to the present invention provides for increased operating speed and performance of the semiconductor device. Additionally, the present invention allows formation of semiconductor devices with decreased resistivity and increased conductivity, increasing the operating speed of the semiconductor devices and allowing more drive current.

Figure 2:
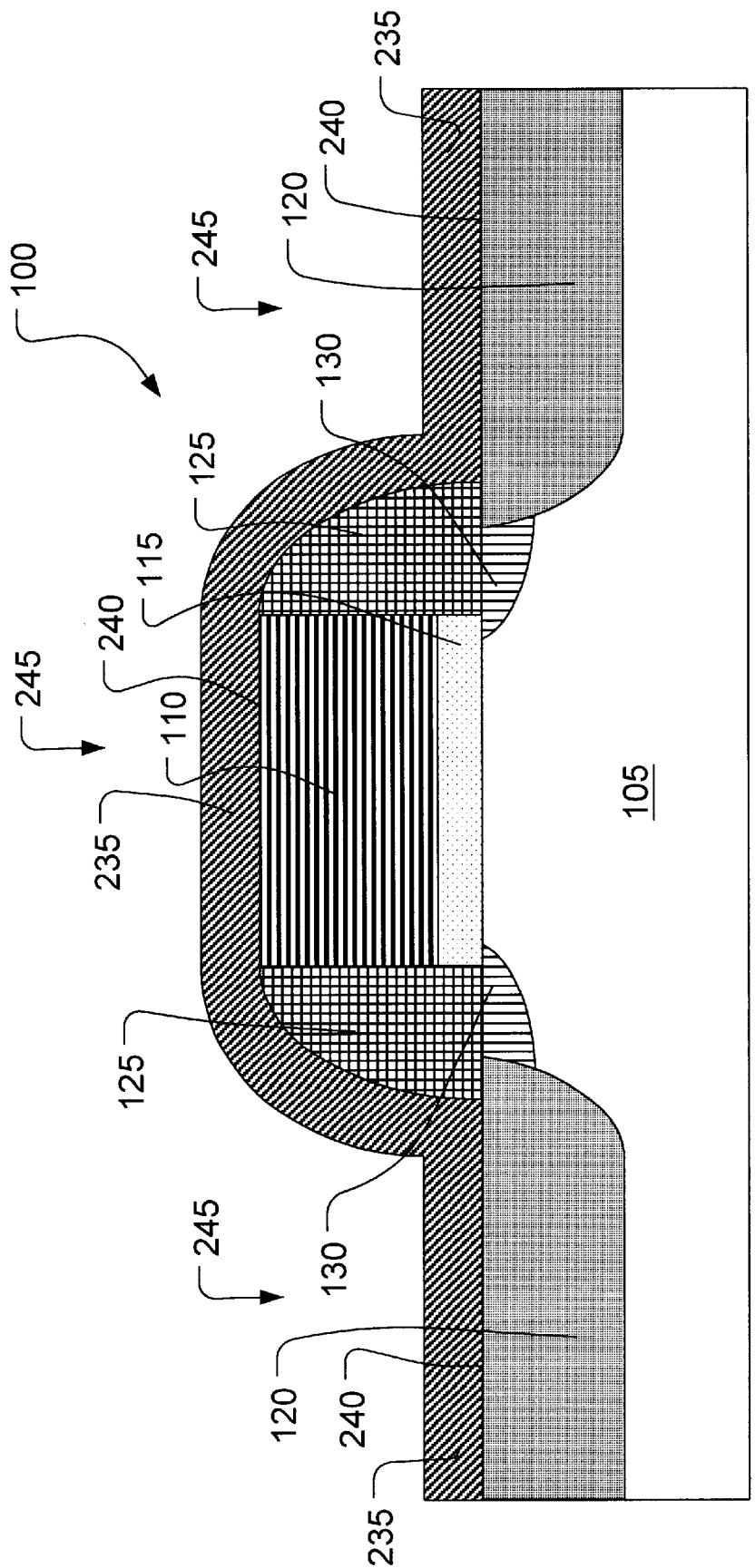
Figure 3:
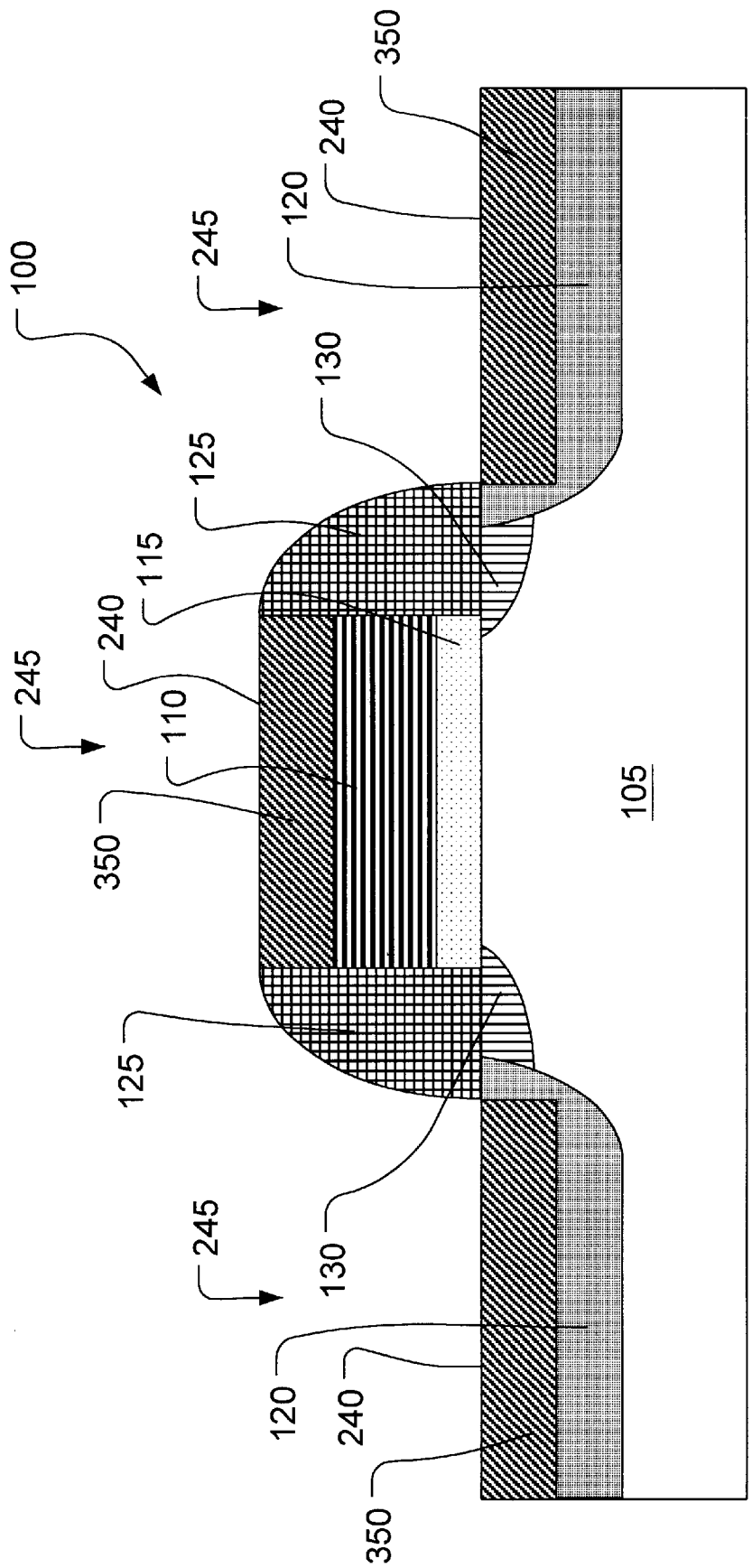

As described above, referring to FIGS. 1–3, even though conventional salicided $TiSi_2$ (or salicided $CoSi_2$) lowers the contact resistances of active areas 245, such as the $N^+$-doped ($P^+$-doped) source/drain regions 120 and the doped-poly gate 110, the $N^-$-doped ($P^-$-doped) LDD regions 130 continue to degrade the device drive current, and the source/drain current through the device, because of the higher resistances of the $N^-$-doped ($P^-$-doped) LDD regions 130. The overall source-to-drain resistance, even with the conventional salicided $TiSi_2$ 350 in the $N^+$-doped ($P^+$-doped) source/drain regions 120, is significantly determined by the lower dopings, and, hence, higher resistances, of the $N^-$-doped ($P^-$-doped) LDD regions 130. By way of contrast, any of the above-disclosed embodiments (see FIGS. 4–12) of a method for fabricating a semiconductor device according to the present invention provides for lower resistances of the $N^-$-doped ($P^-$-doped) LDD regions 420. The overall source-to-drain resistance, even with the conventional salicided $TiSi_2$ 350 in the $N^+$-doped ($P^+$-doped) source/drain regions 970, is no longer determined by the lower dopings, and, hence, higher resistances, of the $N^-$-doped ($P^-$-doped) LDD regions 420, because the salicidization process renders the doped-poly gate 410 and the $N^-$-doped ($P^-$-doped) LDD regions 420 of the structure 405 more conductive by providing the salicided first conductive layers 740, lowering the overall source-to-drain resistance and resistivity of the MOS transistor 400.

Furthermore, the above-disclosed embodiments of methods for semiconductor device fabrication according to the present invention enable semiconductor device fabrication with increased device density and precision and an increased signal-to-noise ratio, and enable a streamlined and simplified process flow. For example, no additional masking steps are required to form both salicided source/drain regions and salicided LDD regions in an MOS transistor and to reduce the device channel length. This decreases the complexity, and lowers the costs, of the manufacturing process, increasing reliability and throughput.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device comprising:
    a structure;
    a grate dielectric above the structure;
    a grate conductor above the gate dielectric;
    an LDD region of the structure adjacent the gate dielectric and the gate conductor;
    a dielectric layer adjacent the grate conductor and the gate dielectric; and
    a salicided first conductive layer above the gate conductor and above the LDD region, the semiconductor device further comprising;
    a dielectric spacer adjacent the dielectric layer adjacent the gate conductor;
    a source/drain region of the structure adjacent the dielectric spacer; and
    a salicided second conductive layer above the gate conductor and above the source/drain region.

2. The semiconductor device of claim 1, wherein the first conductive layer includes one of tungsten, molybdenum and cobalt and wherein the second conductive layer includes one of titanium, tantalum, nickel, zirconium, tungsten, molybdenum and cobalt.

3. The semiconductor device of claim 1, wherein the dielectric layer includes one of an oxide and an oxynitride.

4. The semiconductor device of claim 1, wherein the dielectric spacer includes a material selective to the salicided first conductive layer.

5. A MOSFET comprising:
    a substrate;
    a gate dielectric above the substrate;
    a gate conductor above the gate dielectric;
    LDD regions of the substrate adjacent the gate dielectric and the gate conductor;
    a dielectric layer adjacent the gate conductor and the gate dielectric;
    a salicided first conductive layer above the gate conductor and above the LDD regions;
    dielectric spacers adjacent the dielectric layer adjacent the gate conductor;
    source/drain regions of the substrate adjacent the dielectric spacers; and
    a salicided second conductive layer above the gate conductor and above the source/drain regions.

6. The MOSFET of claim 5, wherein the first conductive layer includes one of tungsten, molybdenum and cobalt.

7. The MOSFET of claim 5, wherein the second conductive layer includes one of titanium, tantalum, nickel, zirconium, tungsten, molybdenum and cobalt.

8. The MOSFET of claim 5, wherein the dielectric layer includes one of an oxide and an oxynitride.

9. The MOSFET of claim 5, wherein the dielectric spacers include a material selective to the salicided first conductive layer.

10. A MOSFET on a substrate formed by a method comprising:
    depositing a dielectric layer adjacent a gate conductor and gate dielectric of the MOSFET and above LDD regions of the substrate;
    etching away a first portion of the dielectric layer above the gate conductor and above the LDD regions;
    depositing a first conductive layer above the gate conductor, adjacent the dielectric layer and above the LDD regions;
    annealing the first conductive layer above the gate conductor and above the LDD regions to form a salicided first conductive layer;
    forming dielectric spacers adjacent a second portion the dielectric layer adjacent the gate conductor and the gate dielectric;

implanting a dopant into source/drain regions of the substrate;

depositing a second conductive layer adjacent the dielectric spacers and above the salicided first conductive layer above the gate conductor and above the source/drain regions; and annealing the second conductive layer above the gate conductor and above the source/drain regions to form a salicided second conductive layer.

11. The MOSFET of claim 10, wherein depositing the first conductive layer includes depositing one of tungsten, molybdenum and cobalt.

12. The MOSFET of claim 10, wherein depositing the second conductive layer includes depositing one of titanium, tantalum, nickel, zirconium, tungsten, molybdenum and cobalt.

13. The MOSFET of claim 10, wherein depositing the dielectric layer includes depositing one of an oxide and an oxynitride.

14. The MOSFET of claim 10, wherein forming the dielectric spacers includes forming the dielectric spacers from a material selective to the salicided first conductive layer.

* * * * *